United States Patent [19]

Behrens et al.

[11] Patent Number: 4,553,148

[45] Date of Patent: Nov. 12, 1985

[54] OPTICAL PRINTER FOR LINE-BY-LINE IMAGE FORMING

[75] Inventors: Herbert Behrens, Neuenburg; Jürgen Schmitt, Stadland; Rainer Marx; Helmut Heidemann, both of Wilhelmshaven; Gerhard Schipper, Rechtsupweg, all of Fed. Rep. of Germany

[73] Assignee: Olympia Werke AG, Wilhelmshaven, Fed. Rep. of Germany

[21] Appl. No.: 505,399

[22] Filed: Jun. 17, 1983

[30] Foreign Application Priority Data

Jun. 19, 1982 [DE] Fed. Rep. of Germany ....... 3223031

[51] Int. Cl.$^4$ ........................ G01D 9/42; G01D 15/14
[52] U.S. Cl. ................................ 346/107 R; 313/500; 346/160; 354/5; 355/3 R
[58] Field of Search ............... 355/3 R, 8, 1; 362/800; 313/500; 354/3, 4, 5; 346/107 R, 160

[56] References Cited

U.S. PATENT DOCUMENTS

| 3,827,062 | 7/1974 | Mailloux | 354/5 |
| 3,869,637 | 3/1975 | Usui | 313/500 |
| 3,952,311 | 4/1976 | Lapeyre | 354/4 X |
| 4,000,495 | 12/1976 | Pirtle | 354/5 X |
| 4,096,486 | 6/1978 | Pfeifer et al. | 354/4 X |
| 4,107,687 | 8/1978 | Pfeifer et al. | 354/5 X |
| 4,376,282 | 3/1983 | Kotani et al. | 354/5 X |
| 4,447,126 | 5/1984 | Heidrich | 354/5 X |

FOREIGN PATENT DOCUMENTS

| 2557254 | 6/1977 | Fed. Rep. of Germany . |
| 2606596 | 8/1977 | Fed. Rep. of Germany . |
| 2812206 | 10/1979 | Fed. Rep. of Germany . |
| 3031295 | 3/1981 | Fed. Rep. of Germany . |

Primary Examiner—Fred L. Braun
Attorney, Agent, or Firm—Spencer & Frank

[57] ABSTRACT

A printer has an optical printing head for a line-by-line image forming of design and text information. The printing head has spaced light emitting elements arranged in a row and each having a light emitting surface. The printing head further has an optical device for reproducing the light, emitted by the light emitting elements, in one line on a light sensitive surface. The light emitting surface of each light emitting element has, parallel to the feed direction of the light sensitive surface, a dimension several times the length of image dots to be reproduced on the light sensitive surface. The optical device has an image reproducing first optical lens and a second optical lens situated between the first optical lens and the light sensitive surface for reducing the image of the light emitting surface of each light emitting element to a required light dot size on the light sensitive surface.

17 Claims, 9 Drawing Figures

OPTICAL PRINTER FOR LINE-BY-LINE IMAGE FORMING

BACKGROUND OF THE INVENTION

This invention relates to a printer having an optical printing head for the line-by-line image forming of text and design information. The printing head is of the type that has a plurality of light emitting devices (assemblies) each having a plurality of selectively energizable light emitting elements arranged in a row. The printing head further includes an optical device for reproducing, in one line, the light emanating from the light emitting elements on a light sensitive surface of a carrier such as a drum.

In data processing systems rapid printers are needed to transform the electric input signals into a visible representation readily recognizable as a printout. For this purpose, printers with optical printing heads have been successfully used. Thus, German Offenlegungsschrift (Application Published without Examination) No. 2,557,254 discloses an optical writing apparatus working with a light sensitive record carrier, photographic paper or intermediate record carrier and having an electrically controlled optical component with image dot elements which block or transmit the light flow. German Offenlegungsschrift No. 2,812,206 discloses an optical printer having a magnetically controlled optical component, based on an integrated light modulating matrix. This system does not need a light beam to be deflected or an electrostatic charging for the printing step proper. Such an integrated light modulating matrix, disclosed, for example, in German Offenlegungsschrift No. 2,606,596, is based on the light modulation by magneto-optical memory layers such as almandite layers. The layers are formed of a uniform arrangement of light switching elements which are switched solely electronically via vapor-deposited conductor and resistor strips. In case of high integrating density, line-shaped light switching components having over 1,000 elements may be constructed. The light switching elements are arranged between a permanent light source and a light sensitive record carrier and are controlled by a character generator in such a manner that the light continuously emitted by the light source can be blocked or transmitted at predetermined image grid dots as required. For forming a single straight image line on the light sensitive surface, there are required a large number of light switching elements arranged side-by-side in one row and transversely to the direction of advance (feed) of the record carrier. Between the light switching elements and the record carrier there is provided an optical system for adapting the image to the printing surface of the record carrier.

Further, German Offenlegungsschrift No. 3,031,295 discloses an optical printer wherein the switchable light switching elements are formed of solid state light emitting diodes. These light emitting elements are combined block-wise into light emitting assemblies which are arranged alternatingly in two rows parallel to the imaging lines; with each row there is associated a separate row of optical image forming system comprising a Selfoc lens. Such a two-row arrangement is necessary for producing a continuous line on the record carrier, since the light emitting elements are shorter than their carrier body and the image forming optical system can reproduce only in a 1:1 ratio.

In prior art structures the light emitting elements are designed as narrow strips having a dimension of 20 micron in a direction parallel to the feed of the record carrier and 90 micron in the transverse direction. By maintaining the period of illumination for one feed increment of approximately 80 micron of the intermediate carrier, there is obtained an illuminated spot of approximately 100 micron. This means that in case of a relatively high operating speed of a printer, the light emitting elements must operate with a high output of light emission which may lead to a shortening of service life particularly because of increased heat removal problems.

For generating a uniform, throughgoing light line on the light sensitive surface of a record carrier, a uniform spacing of the serially arranged light emitting elements is required. The small distance of 10 micron necessary for a high resolution requires high manufacturing precision and renders assembly and adjustment difficult.

SUMMARY OF THE INVENTION

It is an object of the invention to provide an improved optical printer which includes switchable light emitting elements and which, as compared to prior art structures, is simpler to manufacture, assemble and adjust. It is a further object of the invention to provide an improved optical printer which allows the use of light insensitive surfaces (selenium and silicon as opposed to, for example, arsenic selenide) on the carriers (drums), rendering the electrophotographic process insensitive to scattered light. It is still another object of the invention to provide an improved optical printer whose light output is increased to such an extent that printing speeds of up to 100 sheets per minute can be reached.

These objects and others to become apparent as the specification progresses, are accomplished by the invention, according to which, briefly stated, the printer has an optical printing head for a line-by-line image forming of design and text information. The printing head has spaced light emitting elements arranged in a row and each having a light emitting surface. The printing head further has an optical device for reproducing the light, emitted by the light emitting elements, in one line on a light sensitive surface. The light emitting surface of each light emitting element has, parallel to the feed direction of the light sensitive surface, a dimension several times the length of image dots to be reproduced on the light sensitive surface. The optical device has an image reproducing first optical lens and a second optical lens situated between the first optical lens and the light sensitive surface for reducing the image of the light emitting surface of each light emitting element to a required light dot size on the light sensitive surface.

By increasing the light emitting surface of the individual light emitting elements, there is effected either an equal light utilization in case of a smaller input related to the surface or there is obtained a significantly increased light exploitation in case of an identical input related to the surface.

According to a further feature of the invention, the image forming optical system comprises focused fiber optic wafer arrangement for reducing the light emitting surface of the individual light emitting elements in a simple manner to the required shape on the record carrier.

The increased surface area of the light emitting elements in a direction parallel to the feed of the light sensitive surface is achieved in a simple manner by increasing the light emitting surface of each individual light emitting element or by serially arranging several light emitting elements in the feed direction of the light sensitive surface.

DESCRIPTION OF THE PREFERRED EMBODIMENTS

Figure 1:
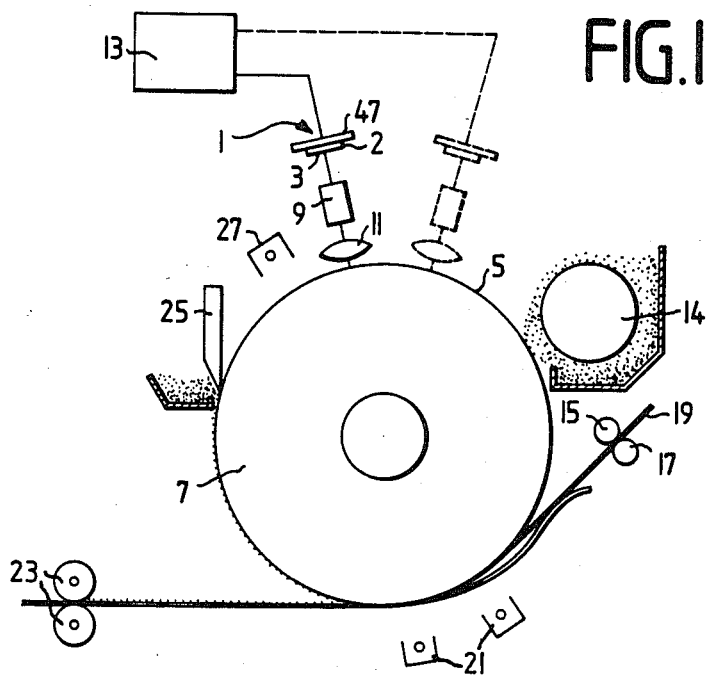
FIG. 1 is a schematic side elevational view of an optical printer incorporating the invention.

Turning now to FIG. 1, there is shown a printer having an optical printing head generally indicated at 1 for a line-by-line image forming of design and text information according to the invention. A driver circuit which is not illustrated in detail and which may be, for example, a component of a character generator 13 controls in a known manner light emitting assemblies 2 each having a plurality of light emitting elements 3 which may be solid state light emitting diodes. The information formed by the light emitting elements 3 of the light emitting assemblies 2 are reproduced in one imaging line by means of image forming systems 9 and 11 on a light sensitive surface 5 of a drum 7 serving as a record carrier. The light emitting elements 3 which function as controllable optical structural elements may be replaced by other image forming systems such as, for example, magneto-optical switching elements (not shown) by means of which a light emitted continuously from a light source is, as required, interrupted or transmitted at predetermined image grid dots. The light image emitted by the light emitting elements 3 is directed, by means of a lens system 9 serving as a reproducing optical system, to a cylinder lens 11 arranged along the light sensitive surface 5 parallel to the line direction.

The lens system 9 comprises focused fiber optic wafers 10 each having an image transmitting component composed of many individual optical fibers arranged with precision at each end. The index of refraction varies in a uniform gradation over a cross section, whereby the wafer forms a lens rather than constituting merely a light transmitting conduit. Such lens system which is marketed under the trademark Selfoc by Nippon Sheet Glass Company, Ltd. of Osaka, Japan, is described in more detail in the September 1978 issue of the periodical Product Engineering, page 15 and in the May 1983 issue of the periodical High Technology (Vol. 3, No. 5), in an article by Cary Lu, entitled New Copiers Offer Smarts and Simplicity.

Figure 2:
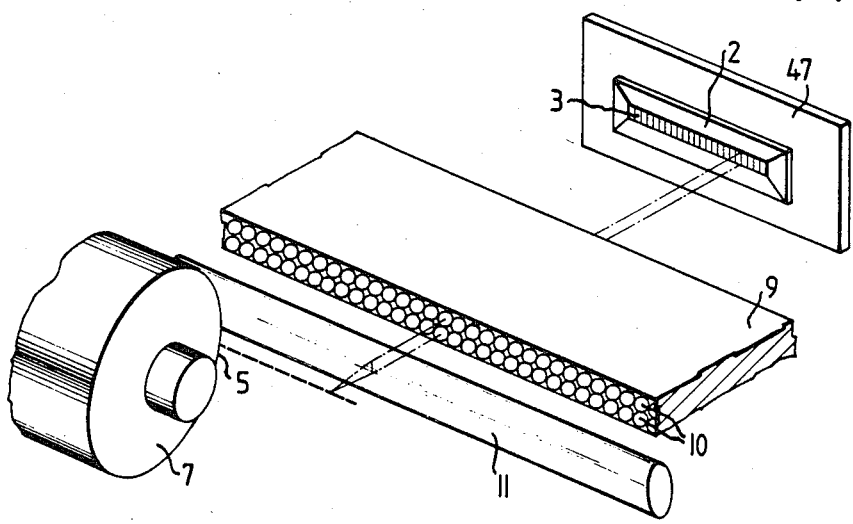
FIG. 2 is a perspective schematic fragmentary detail of the structure shown in FIG. 1.

As illustrated in FIG. 2, the cylinder lens 11 reduces the imaging surface of the individual light emitting elements 3 on the light sensitive surface 5 in its feed direction to a light dot size required for a high resolution, whereas the reproduction in the line direction is affected in a ratio of 1:1. The presence of the cylinder lens 11 is important for achieving the light gathering effect. In this manner, a line-by-line image forming of text and design information on the light sensitive record carrier 5 may be effected by means of the optical printing head 1. The latent image thus produced is electrographically developed and fixed in a conventional manner. For this purpose there are provided a developing device 14, a paper feeder roller pair 15, 17 for pulling in a record carrier sheet 19, a transfer station 21 and a fixing device 23 formed of pressing rolls. About the drum 7 there are further provided a cleaning device 25 and a charging corona 27.

Figure 3:
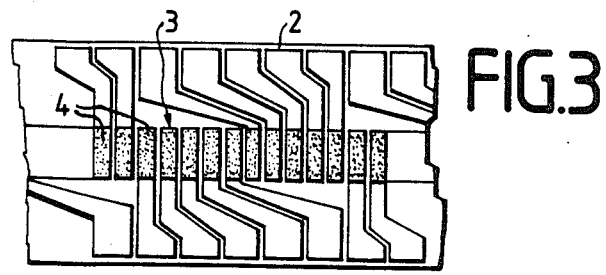
FIG. 3 is a plan view of a preferred embodiment of light emitting elements forming part of the invention.

In order to achieve the same light yield in case of a smaller input related to the surface or to achieve a substantially increased yield in case of the same input related to the surface, the size of the light emitting surface 4 (shown, for example, in FIG. 3) of the light emitting elements 3 is, in the feed direction of the light sensitive carrier 7, a multiple of the surface of the light dots to be reproduced on the light sensitive surface 5. The light images emitted by the light emitting elements 3 are transferred by means of the lens system 9 to the cylinder lens 11 in a 1:1 ratio. Then, the cylinder lens 11 reproduces the light images on the light sensitive surface 5, reduced in one direction. As shown in FIG. 3, the light emitting surface 4 of the light emitting elements 3 has, in the direction of feed of the light sensitive surface 5, a dimension which is several times greater than its dimension in the transverse direction.

Figure 4:
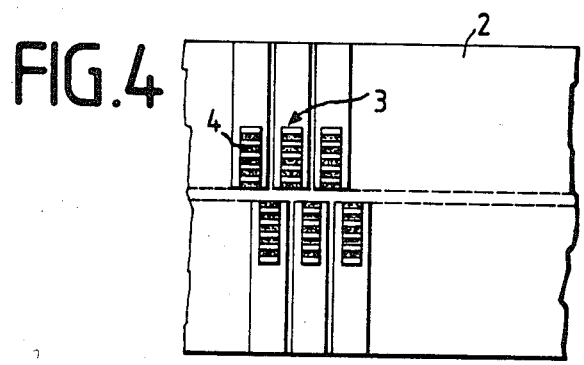
FIG. 4 is a plan view of another preferred embodiment of light emitting elements forming part of the invention.
Figure 5:
FIG. 5 is a view of an image line reproduced with the structure shown in FIG. 4.

The area of the light emitting elements 3 may be significantly increased in the working (feed) direction of the light sensitive surface 5 by serially arranging a plurality of light emitting elements 3 in the feeding direction of the light sensitive surface 5 to form a group as shown in FIG. 4. These groups of light emitting elements 3 which are energized concurrently by the image generator 13, may be arranged either in one row spaced 0.1 mm relative to one another or, as shown in FIG. 4, they may be arranged alternatingly in two rows in a staggered manner. Although by means of the staggered arrangement there is achieved a good overlap on the individual grid dots in the line direction, the light line reproduced on the light sensitive surface 5 is, however, composed by two slightly offset light dot rows as shown in FIG. 5. Such an offset image forming can be eliminated by providing that one line of the light emitting elements 3, corresponding to the feed path of the copier drum 7, is energized in a timewise offset manner. Such a timewise offset energization of the appropriate light emitting elements 3 may be controlled by an electronic control circuit as a function of the rpm of the drum 7 or by a commercial microcomputer or commercial microprocessor (such as Model 8080 manufactured by Intel Corp., Santa Clara, Calif.).

Figure 8:
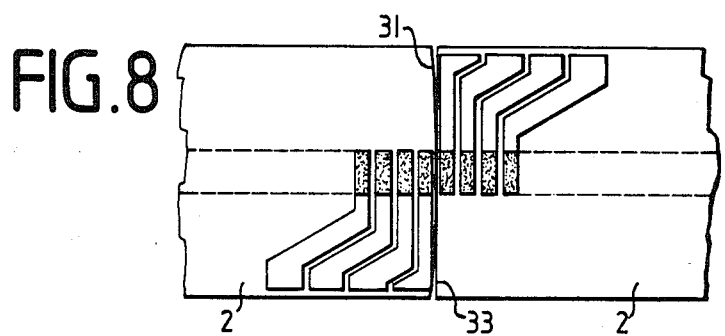
FIG. 8 is a plan view of still another preferred embodiment of light emitting assemblies.

For producing a uniform light line on the light sensitive surface 5 in case all the light elements 3 are, over the entire line length, arranged in a single row, it is of importance that the light emitting elements 3 within the same light emitting assembly 2 and the neighboring light emitting elements of two adjoining light emitting assemblies 2 have the same distance from one another. For this reason, the light emitting assemblies 2 have to be manufactured with precisely dimensioned surfaces where adjoining light emitting assemblies 2 are in engagement with one another. Even slight soiling of the engaging surfaces of the light emitting assemblies 2 may lead to an imprecise positioning of the assemblies. This undesirable occurrence is avoided according to the invention by providing that an engagement surface 31 of at least one of the adjoining light emitting assemblies 2 has a slightly rounded (spherical) surface as illustrated in FIG. 8. The counter surface 33 of the other light emitting assembly 2 may be planar. By means of the slightly rounded engaging face 31 there is achieved a point-like contact between the two light emitting assemblies, so that dust particles and the like lodging between the engagement faces 31 and 33 do not have an appreciably disturbing effect upon connecting the assembly blocks to one another.

Figure 6:
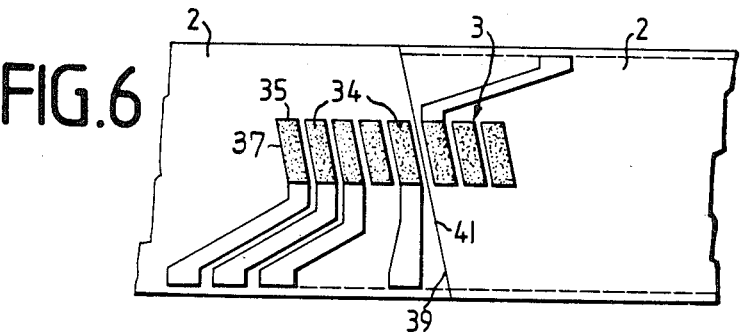
FIG. 6 is a plan view of still another preferred embodiment of light emitting elements and light emitting assemblies.
Figure 7:
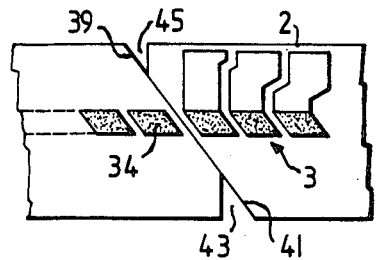
FIG. 7 is a plan view of a further preferred embodiment of light emitting assemblies.

Referring now to FIG. 3, the light emitting elements 3 have, according to one embodiment, a width of 90 micron and are spaced from one another at a distance of 10 micron to provide an electric insulation of the individual light emitting elements 3 from one another. Such a spacing which is small by itself, has theoretically the disadvantage that upon printout by means of a light sensitive intermediate carrier (copier drum), whose latent image is developed by a toner, in the areas which are not covered by the photographically reproduced LED light dots, there are generated zones which cannot be uniformly erased. In such a border zone, this effect could be compensated for either by means of an intentional blur of the reproduced LED elements or by means of an intentional over- or under-exposure in which the edges of the lines or characters are blurry, that is, they appear enlarged or narrowed. Since the above-noted distance of 0.01 mm lies in the border zone or still under the resolution capacity of the electrophotographic process, such a construction of the individual elements would still be operationally reliable. Such a small distance of 10 microns, however, may not be observed for manufacturing reasons if two light emitting assemblies 2 should be in a direct abutting contact with one another. It has been found in practice that this distance will be at least doubled and, as a result, the printed image will not be satisfactory. This disadvantage is eliminated by an advantageous further feature of the invention shown in FIG. 6. In this embodiment the light emitting surfaces 34 of the individual light emitting elements 3 are of oblique parallelogram shape. The short sides 35 of the parallelograms extend perpendicularly to the feed direction of the light sensitive surface 5 and the long sides 37 extend obliquely thereto in such a manner that, as viewed in the feed direction of the light sensitive surface 5, an overlap is obtained in the transition zones between the invidual light emitting elements 3 even at the transition between two light emitting assemblies 2. In this manner, a galvanic separation of the individual light emitting elements 3 is positively preserved. By means of the overlap in the transition zones, the stringent requirements concerning manufacturing tolerances, assembly and adjustment of the individual light emitting elements 3 can be significantly relaxed. These advantages are achieved in parallel printers having several immediately adjoining light emitting assemblies 2 by ensuring that the cooperating engagement faces 39, 41 of the individual blocks of the light emitting assemblies 2 are parallel to the long sides 37 of the parallelogram-shaped surfaces 34 of the light emitting elements 3, as illustrated in FIG. 6. Turning to FIG. 7, the spacing may be observed in an improved manner by providing that the abutting faces 39 and 41 have, at their outer end, a free angled part 43 and 45, respectively. The angled parts 43 and 45 are obtained by cutting the acute angles of the parallelogram-shaped blocks of the light emitting assemblies 2. The above-described parallelogram arrangement of the light emitting elements 3 as well as the angled parts 43, 45 of the blocks of the light emitting assemblies 2 significantly facilitate the making of the individual light emitting elements 3 and their mounting in the blocks of the light emitting assemblies, as well as the making and mounting of the blocks proper.

Figure 9:
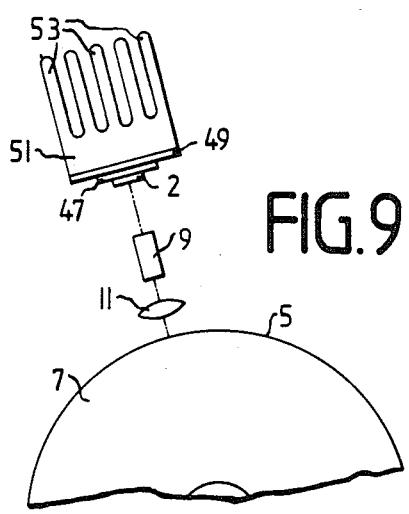
FIG. 9 is a schematic side elevational view of a detail of the structure shown in FIG. 1.

Turning now to FIGS. 1, 2 and 9, the light emitting assemblies 2 are arranged on a ceramic plate 47 which functions as a carrier and on which there are additionally positioned control elements, such as hybrid switching elements which, in operation, may also generate heat in addition to the LED's. Since light emitting characteristics of the light emitting elements 3 are significantly influenced by heat, care has to be taken that a good cooling is provided, particularly because the ceramic carrier 47 itself is a poor heat conductor. To provide a satisfactory cooling, a conventional fan may direct an air stream from above while the heat is withdrawn downwardly by means of a cooling body 51 provided with cooling ribs 53. The cooling body 51 is of aluminum which, although it has very good heat conducting properties, is, however, not able by itself to draw away the heat emanating from the underside of the ceramic plate 47 in an optimal manner even in case of lateral enlargements. The heat removal is, as shown in FIG. 9, enhanced by providing, between the ceramic plate 47 and the cooling body 51, a metal layer 49 which has a superior heat conducting property, such a pure silver. By means of the metal layer 49 the heat fields emanating from the ceramic plate 47 are very rapidly distributed sidewise, so that they can be taken up more easily by the cooling body 51 and may be eventually led away. Such an arrangement makes possible the use of optical printers even at printout speeds of 100 sheets per minute.

It will be understood that the above description of the present invention is susceptible to various changes, modifications and adaptations, and the same are intended to be comprehended within the meaning and range of equivalents of the appended claims.

What is claimed is:

1. A printer including a carrier having a light sensitive surface and being driven in a feed direction and an optical printing head for a line-by-line image forming of design and text information; said optical printing head having a plurality of light emitting elements arranged in a row and each having a light emitting surface, said light emitting surfaces being spaced from one another; and an optical device for reproducing the light, emitted by the light emitting elements, in one line on said light sensitive surface; the improvement wherein said light emitting surface of each said light emitting element has, parallel to said feed direction, a dimension several times the dimension, in the feed direction, of image dots to be reproduced on said light sensitive surface, and further wherein said optical device has an image reproducing first optical lens means and a second optical lens means situated between said first optical lens means and said light sensitive surface for reducing the image of the light emitting surface of each light emitting element solely in a direction parallel to said feed direction to a required light dot size on said light sensitive surface.

2. A printer as defined in claim 1, wherein said second optical lens means comprises a cylinder lens arranged parallel to image lines to be reproduced on said light sensitive surface.

3. A printer as defined in claim 1, wherein said light emitting surface of each said light emitting element has, parallel to said feed direction, a length dimension several times greater than the dimension of the respective said light emitting surface in a direction transverse to said feed direction.

4. A printer as defined in claim 1, wherein said light emitting elements are solid state light emitting diodes.

5. A printer as defined in claim 1, further comprising a ceramic plate carrying said light emitting elements, a highly heat conducting metal layer on a surface of said ceramic plate and a cooling body in contact with said metal layer; said cooling body having cooling ribs.

6. A printer as defined in claim 5, wherein said cooling body is aluminum.

7. A printer as defined in claim 1, wherein said light emitting elements are combined in adjoining light emitting assemblies each being supported in a separate block; each said block having an engagement face; the blocks of adjoining light emitting assemblies being in contact with one another at the engagement faces.

8. A printer as defined in claim 7, wherein at least one of the contacting engagement faces is rounded.

9. A printer as defined in claim 1, wherein each light emitting surface emitting light for reproducing one light dot is composed of a group of light emitting surfaces each belonging to a separate light emitting element; the light emitting surfaces within one group being serially arranged in said feed direction.

10. A printer as defined in claim 9, wherein said light emitting elements are arranged alternatingly in two staggered rows.

11. A printer as defined in claim 10, further comprising a rotary drum carrying said light sensitive surface and control means for a timewise staggered energization of said light emitting elements as a function of the rpm of said rotary drum.

12. A printer as defined in claim 11, wherein said control means comprises a microprocessor.

13. A printer as defined in claim 1, wherein said light emitting elements are combined in adjoining light emitting assemblies each being supported in separate juxtaposed blocks; each said light emitting surface having the shape of an oblique parallelogram having opposite first sides and opposite second sides; said first sides of each said parallelogram extending obliquely to said feed direction and said second sides extending perpendicularly to said feed direction; adjoining light emitting surfaces belonging to a common said light emitting assembly and adjoining light emitting surfaces belonging to different, adjoining light emitting assemblies being in an overlapping relationship as viewed in said feed direction.

14. A printer as defined in claim 13, wherein each said block has an engagement face and the blocks of adjoining light emitting assemblies are in contact with one another at the engagement faces and further wherein said engagement faces are arranged parallel to the first sides of said parallelograms.

15. A printer as defined in claim 13, wherein each said block has an engagement face and the blocks of adjoining light emitting assemblies are in contact with one another at the engagement faces and further wherein each said engagement face has a free outer angled part.

16. A printer as defined in claim 13, wherein said first sides are long sides of said oblique paralellogram and said second sides are short sides of said paralellogram.

17. A printer as defined in claim 1, wherein said image reproducing first optical lens means comprises lenses constituted by focused optical fibers.

* * * * *